(12) United States Patent
Myles et al.

(10) Patent No.: US 12,148,645 B2
(45) Date of Patent: Nov. 19, 2024

(54) CALIBRATION JIG AND CALIBRATION METHOD

(71) Applicant: Applied Materials, Inc., Santa Clara, CA (US)

(72) Inventors: Andrew Myles, Sunnyvale, CA (US); Denis Martin Koosau, Sunnyvale, CA (US); Peter Muraoka, Santa Clara, CA (US); Phillip Criminale, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/435,175

(22) Filed: Feb. 7, 2024

(65) Prior Publication Data

US 2024/0178035 A1    May 30, 2024

Related U.S. Application Data

(62) Division of application No. 16/407,520, filed on May 9, 2019, now Pat. No. 11,935,773.

(60) Provisional application No. 62/685,004, filed on Jun. 14, 2018.

(51) Int. Cl.
*H01L 21/68* (2006.01)
*H01J 37/32* (2006.01)
*H01L 21/687* (2006.01)

(52) U.S. Cl.
CPC ........ *H01L 21/68* (2013.01); *H01J 37/32642* (2013.01); *H01J 37/3288* (2013.01); *H01J 37/32908* (2013.01); *H01J 37/32935* (2013.01); *H01J 37/3299* (2013.01); *H01L 21/681* (2013.01); *H01L 21/68721* (2013.01); *H01L 21/68735* (2013.01); *H01L 21/68742* (2013.01)

(58) Field of Classification Search
None
See application file for complete search history.

(56) References Cited

U.S. PATENT DOCUMENTS

| | | |
|---|---|---|
| 5,267,607 A | 12/1993 | Wada |
| 5,660,673 A | 8/1997 | Miyoshi |
| 5,730,801 A | 3/1998 | Tepman et al. |
| 5,762,714 A | 6/1998 | Mohn et al. |
| 5,851,140 A | 12/1998 | Barns et al. |

(Continued)

FOREIGN PATENT DOCUMENTS

| | | |
|---|---|---|
| CN | 105336561 A | 2/2016 |
| CN | 105789010 A | 7/2016 |

(Continued)

OTHER PUBLICATIONS

Chinese Office Action issued to Patent Application No. 201910513045.1 on Jan. 19, 2024.

(Continued)

*Primary Examiner* — Jason Berman
(74) *Attorney, Agent, or Firm* — Patterson + Sheridan, LLP

(57) ABSTRACT

Apparatus and methods for calibrating a height-adjustable edge ring are described herein. In one example, a calibration jig for positioning an edge ring relative to a reference surface is provided that includes a transparent plate, a plurality of sensors coupled to a first side of the transparent plate, and a plurality of contact pads coupled to an opposing second side of the transparent plate.

20 Claims, 3 Drawing Sheets

(56) References Cited

U.S. PATENT DOCUMENTS

| | | | |
|---|---|---|---|
| 5,885,428 A | 3/1999 | Kogan | |
| 5,942,078 A | 8/1999 | Abrahamson | |
| 6,022,809 A | 2/2000 | Fan | |
| 6,044,534 A | 4/2000 | Seo et al. | |
| 6,121,675 A | 9/2000 | Fukamura et al. | |
| 6,206,976 B1 | 3/2001 | Crevasse et al. | |
| 6,375,748 B1 | 4/2002 | Yudovsky et al. | |
| 6,391,787 B1 | 5/2002 | Dhindsa et al. | |
| 6,511,543 B1 | 1/2003 | Stauss et al. | |
| 6,589,352 B1 | 7/2003 | Yudovsky et al. | |
| 6,676,759 B1 | 1/2004 | Takagi | |
| 6,709,547 B1 | 3/2004 | Ni et al. | |
| 6,744,212 B2 | 6/2004 | Fischer et al. | |
| 6,773,562 B1 | 8/2004 | Inagawa et al. | |
| 6,896,765 B2 | 5/2005 | Steger | |
| 6,898,558 B2 | 5/2005 | Klekotka | |
| 7,138,014 B2 | 11/2006 | Stevens et al. | |
| 7,138,067 B2 | 11/2006 | Vahedi et al. | |
| 7,176,403 B2 | 2/2007 | Steger | |
| 7,252,738 B2 | 8/2007 | Tong et al. | |
| 7,311,784 B2 | 12/2007 | Fink | |
| 7,338,578 B2 | 3/2008 | Huang et al. | |
| 7,589,950 B2 | 9/2009 | Parkhe et al. | |
| 7,824,146 B2 | 11/2010 | Lanee et al. | |
| 7,968,469 B2 | 6/2011 | Collins et al. | |
| 8,270,141 B2 | 9/2012 | Willwerth et al. | |
| 8,298,371 B2 | 10/2012 | Koshimizu et al. | |
| 8,441,640 B2 | 5/2013 | Patalay et al. | |
| 8,696,878 B2 | 4/2014 | Riker et al. | |
| 8,900,398 B2 | 12/2014 | Dhindsa et al. | |
| 8,933,628 B2 | 1/2015 | Banna et al. | |
| 8,988,848 B2 | 3/2015 | Todorow et al. | |
| 8,999,106 B2 | 4/2015 | Liu et al. | |
| 9,011,637 B2 | 4/2015 | Yamamoto | |
| 9,017,526 B2 | 4/2015 | Singh et al. | |
| 9,076,636 B2 | 7/2015 | Ohata et al. | |
| 9,142,391 B2 | 9/2015 | Yamamoto | |
| 9,287,093 B2 | 3/2016 | Singh et al. | |
| 9,410,249 B2 | 8/2016 | Male et al. | |
| 9,583,357 B1 | 2/2017 | Long et al. | |
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 9,947,517 B1 | 4/2018 | Luere et al. | |
| 10,103,010 B2 | 10/2018 | Luere et al. | |
| 10,504,702 B2 | 12/2019 | Luere et al. | |
| 10,553,404 B2 | 2/2020 | Luere et al. | |
| 10,600,623 B2 | 3/2020 | Sarode Vishwanath | |
| 10,790,123 B2 | 9/2020 | Sarode Vishwanath | |
| 10,991,556 B2 | 4/2021 | Luere et al. | |
| 2002/0072240 A1* | 6/2002 | Koike | H01J 37/32642 438/710 |
| 2003/0173031 A1 | 9/2003 | Aggarwal et al. | |
| 2003/0201069 A1 | 10/2003 | Johnson | |
| 2004/0053428 A1 | 3/2004 | Steger | |
| 2004/0149389 A1 | 8/2004 | Fink | |
| 2004/0261946 A1 | 12/2004 | Endoh et al. | |
| 2005/0061447 A1 | 3/2005 | Kim et al. | |
| 2005/0133164 A1 | 6/2005 | Fischer et al. | |
| 2005/0263070 A1 | 12/2005 | Fink | |
| 2006/0022694 A1 | 2/2006 | Brunner et al. | |
| 2007/0131253 A1 | 6/2007 | Nakamura et al. | |
| 2008/0066868 A1 | 3/2008 | Masuda | |
| 2008/0173237 A1 | 7/2008 | Collins et al. | |
| 2008/0227301 A1* | 9/2008 | Fang | H01J 37/32642 134/115 R |
| 2008/0236749 A1 | 10/2008 | Koshimizu et al. | |
| 2008/0289766 A1 | 11/2008 | Heemstra et al. | |
| 2009/0041568 A1 | 2/2009 | Muraoka et al. | |
| 2009/0067954 A1 | 3/2009 | Lanee et al. | |
| 2010/0101729 A1 | 4/2010 | Kim et al. | |
| 2010/0196625 A1 | 8/2010 | Yoon et al. | |
| 2010/0206484 A1 | 8/2010 | Hiromi et al. | |
| 2011/0011534 A1 | 1/2011 | Dhindsa | |
| 2011/0031111 A1 | 2/2011 | Kobayashi | |
| 2011/0157760 A1 | 6/2011 | Willwerth et al. | |
| 2011/0287631 A1 | 11/2011 | Yamamoto | |
| 2012/0052599 A1 | 3/2012 | Brouk et al. | |
| 2012/0091108 A1 | 4/2012 | Lin et al. | |
| 2012/0176692 A1 | 7/2012 | Yamawaku et al. | |
| 2012/0256363 A1 | 10/2012 | Okita et al. | |
| 2012/0305184 A1 | 12/2012 | Singh et al. | |
| 2013/0093443 A1 | 4/2013 | Patrick | |
| 2013/0106286 A1 | 5/2013 | Banna et al. | |
| 2013/0155568 A1 | 6/2013 | Todorow et al. | |
| 2014/0017900 A1 | 1/2014 | Doba et al. | |
| 2014/0213055 A1 | 7/2014 | Himori et al. | |
| 2014/0265089 A1 | 9/2014 | Tantiwong et al. | |
| 2015/0064809 A1 | 3/2015 | Lubomirsky | |
| 2015/0181684 A1 | 6/2015 | Banna et al. | |
| 2015/0200124 A1 | 7/2015 | Yamamoto | |
| 2015/0332951 A1 | 11/2015 | Male et al. | |
| 2016/0042926 A1 | 2/2016 | Ishikawa et al. | |
| 2016/0056017 A1 | 2/2016 | Kim et al. | |
| 2016/0211165 A1 | 7/2016 | McChesney et al. | |
| 2016/0211166 A1 | 7/2016 | Yan et al. | |
| 2016/0240415 A1 | 8/2016 | Sekiya | |
| 2017/0018411 A1 | 1/2017 | Sriraman et al. | |
| 2017/0069462 A1 | 3/2017 | Kanarik et al. | |
| 2017/0103870 A1 | 4/2017 | Marakhtanov et al. | |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117170 A1 | 4/2017 | Wong et al. | |
| 2017/0117172 A1 | 4/2017 | Genetti et al. | |
| 2017/0133283 A1 | 5/2017 | Kenworthy | |
| 2017/0178917 A1 | 6/2017 | Kamp et al. | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0250056 A1 | 8/2017 | Boswell et al. | |
| 2017/0263478 A1 | 9/2017 | McChesney et al. | |
| 2017/0278679 A1 | 9/2017 | Angelov et al. | |
| 2017/0287682 A1 | 10/2017 | Musselman et al. | |
| 2017/0287753 A1 | 10/2017 | Musselman et al. | |
| 2017/0316935 A1 | 11/2017 | Tan et al. | |
| 2017/0330786 A1 | 11/2017 | Genetti et al. | |
| 2017/0334074 A1 | 11/2017 | Genetti et al. | |
| 2017/0372912 A1 | 12/2017 | Long et al. | |
| 2018/0019107 A1 | 1/2018 | Ishizawa | |
| 2018/0052104 A1 | 2/2018 | Larsson et al. | |
| 2018/0061696 A1 | 3/2018 | D'Ambra et al. | |
| 2018/0090354 A1 | 3/2018 | Sugita et al. | |
| 2018/0166259 A1 | 6/2018 | Ueda | |
| 2018/0204757 A1 | 7/2018 | Fushimi | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0308737 A1 | 10/2018 | Moriya et al. | |
| 2018/0315583 A1 | 11/2018 | Luere et al. | |
| 2018/0315640 A1 | 11/2018 | Ueda et al. | |
| 2019/0013232 A1 | 1/2019 | Yan et al. | |
| 2019/0088531 A1 | 3/2019 | Sarode Vishwanath et al. | |
| 2019/0172688 A1 | 6/2019 | Ueda | |
| 2019/0172714 A1 | 6/2019 | Bobek et al. | |
| 2019/0318918 A1 | 10/2019 | Saitoh et al. | |
| 2019/0333785 A1 | 10/2019 | Tanikawa | |
| 2019/0362949 A1 | 11/2019 | Sarode Vishwanath | |
| 2020/0020510 A1 | 1/2020 | Shoeb et al. | |
| 2020/0234981 A1 | 7/2020 | Schmid et al. | |

FOREIGN PATENT DOCUMENTS

| | | |
|---|---|---|
| CN | 209747490 U | 12/2019 |
| JP | H0320898 A | 1/1991 |
| JP | 2000049144 A | 2/2000 |
| JP | 3020898 B2 | 3/2000 |
| JP | 2001230239 A | 8/2001 |
| JP | 2002176030 A | 6/2002 |
| JP | 2006186171 A | 7/2006 |

(56) References Cited

FOREIGN PATENT DOCUMENTS

| | | | |
|---|---|---|---|
| JP | 2008078208 A | 4/2008 | |
| JP | 2011054933 A | 3/2011 | |
| JP | 2013511847 A | 4/2013 | |
| JP | 2015050156 A | 3/2015 | |
| KR | 20060117537 A | 11/2006 | |
| KR | 100980972 B1 | 9/2010 | |
| TW | 439093 B | 6/2001 | |
| TW | 201243942 A | 11/2012 | |
| TW | 201324674 A | 6/2013 | |
| TW | 201526101 A | 7/2015 | |
| TW | M587362 U | 12/2019 | |
| WO | 2008005756 A2 | 1/2008 | |
| WO | 2013035983 A1 | 3/2013 | |

OTHER PUBLICATIONS

Chinese Office Action issued to patent application No. 201910513045.1 on May 22, 2024.
"Bracelet Holder Vise Clamp Stone Prong Pave Channel Setting Setter." Prolinemax, www.prolinemax.com/BRACELET-HOLDER-VISE-Clamp-Stone-Prong-Pave-Channel-Setting-Setter-_p_1006.html.
International Search Report and Written Opinion dated Apr. 24, 2017 for Application No. PCT/US2016/069449.
Chinese Office Action for Application No. 201821554985.2 dated Feb. 19, 2019.
Taiwan Office Action dated Mar. 22, 2019 for Application No. 107217385.
Chinese Office Action dated May 16, 2019 for Application No. 201822159176.8.
Notice of Allowance and Fees Due dated Oct. 6, 2017 for U.S. Appl. No. 15/382,004.
Notice of Allowance and Fees Due dated Oct. 25, 2017 for U.S. Appl. No. 15/382,004.
Notice of Allowance and Fees Due dated Feb. 21, 2018 for U.S. Appl. No. 15/382,004.
Notice of Allowance and Fees Due dated Jun. 27, 2018 for U.S. Appl. No. 15/951,540.
Non-Final Office Action dated Feb. 4, 2019 for Application No. 16/026,853.
Notice of Allowance and Fees Due dated Aug. 19, 2019 for U.S. Appl. No. 16/026,853.
Notice of Allowance and Fees Due/ Examiner Initiated Interview Summary dated Sep. 23, 2019 for U.S. Appl. No. 16/026,853.
Taiwan Office Action dated Sep. 20, 2019 for Application No. 106100104.
PCT Notification of Transmittal of the International Search Report and the Written Opinion of the International Searching Authority for International Application No. PCT/US2019/051771; dated Mar. 24, 2020; 11 total pages.
Japanese Office Action for Application No. JP 2019-111014 dated Aug. 25, 2020.
International Search Report and Written Opinion for PCT/US2020/016242 dated Jul. 14, 2020.
Japanese Office Action dated Oct. 27, 2020 for Application No. 2018-522911.
Korean Office Action in related application 10-2019-0069336 dated Nov. 11, 2020.
Notice of Allowance in related application KR10-2019-0069336 dated May 9, 2021.
Office Action in related application TW108120460 dated Jan. 26, 2021.

* cited by examiner

CALIBRATION JIG AND CALIBRATION METHOD

CROSS-REFERENCE TO RELATED APPLICATION

This application is a divisional of U.S. patent application Ser. No. 16/407,520, filed May 9, 2019, which claims benefit of U.S. Provisional Patent Application Ser. No. 62/685,004, filed Jun. 14, 2018, which are hereby incorporated herein by reference.

BACKGROUND

Field

Examples of the present disclosure generally relate to apparatus and methods for processing substrates, such as semiconductor substrates. More particularly, a calibration jig and methods for use thereof are disclosed.

Description of the Related Art

In the processing of substrates, such as semiconductor substrates and display panels, a substrate is placed on a support in a process chamber while suitable process conditions are maintained in the process chamber to deposit, etch, form layers on, or otherwise treat surfaces of the substrate. During etching processes, a plasma, which drives the etching process, may not be uniformly distributed across the substrate surface. The non-uniformity is particularly apparent at the edge of the substrate surface. This non-uniformity contributes to poor processing results. Thus, some process chambers use edge rings, which may also be referred to as a process kit ring. These edge rings may be utilized to extend the plasma sheath over the edge of the substrate surface in order to increase plasma uniformity and improve process yield.

These edge rings are typically coplanar with, or parallel to, a specific reference surface within the chamber in order to provide good results. However, during processing, the edge rings erode over time. To account for the erosion, some edge rings are movable relative to the reference surface within the process chamber. Eventually, the edge ring erodes to a point where replacement is required. However, tight tolerances in the edge ring may cause binding that result in the edge ring being mispositioned relative to the reference surface during installation. In order to correct this mispositioning during installation, the edge ring is repositioned relative to the reference surface which, conventionally, is time consuming.

Therefore, there is a need in the art for methods and apparatuses that reduces downtime during edge ring replacement.

SUMMARY

Apparatus and methods for calibrating a height-adjustable edge ring are described herein. In one example, a calibration jig for positioning an edge ring relative to a reference surface is provided that includes a transparent plate, a plurality of sensors coupled to a first side of the transparent plate, and a plurality of contact pads coupled to an opposing second side of the transparent plate.

In another example, a calibration jig for positioning an edge ring relative to a reference surface is provided that includes a transparent plate including a plurality of openings formed therethrough, a plurality of sensors coupled to a first side of the transparent plate, and a plurality of contact pads coupled to an opposing second side of the transparent plate.

In another example, a method for levelling an edge ring relative to a reference surface is provided that includes positioning a calibration jig relative to the reference surface, moving the edge ring relative to the reference surface using a plurality of drive motors coupled to the edge ring at three axes, sensing movement of the edge ring using sensors coupled to the calibration jig, each sensor corresponding to a position of a respective drive motor, calculating an offset between all axes, and storing a calibration value in a system controller.

BRIEF DESCRIPTION OF THE DRAWINGS

So that the manner in which the above recited features of the present disclosure can be understood in detail, a more particular description of the disclosure, briefly summarized above, may be had by reference to aspects of the disclosure, some of which are illustrated in the appended drawings. It is to be noted, however, that the appended drawings illustrate only typical aspects of this disclosure and are therefore not to be considered limiting of its scope, for the disclosure may admit to other equally effective aspects.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Apparatus and methods for calibrating a height-adjustable edge ring are described herein. In one example, a calibration jig for positioning an edge ring relative to a reference surface is provided that includes a transparent plate, a plurality of sensors coupled to a first side of the transparent plate, and a plurality of contact pads coupled to an opposing second side of the transparent plate. The calibration jig as disclosed herein significantly reduces downtime when installing an edge ring in a process chamber.

Figure 1:
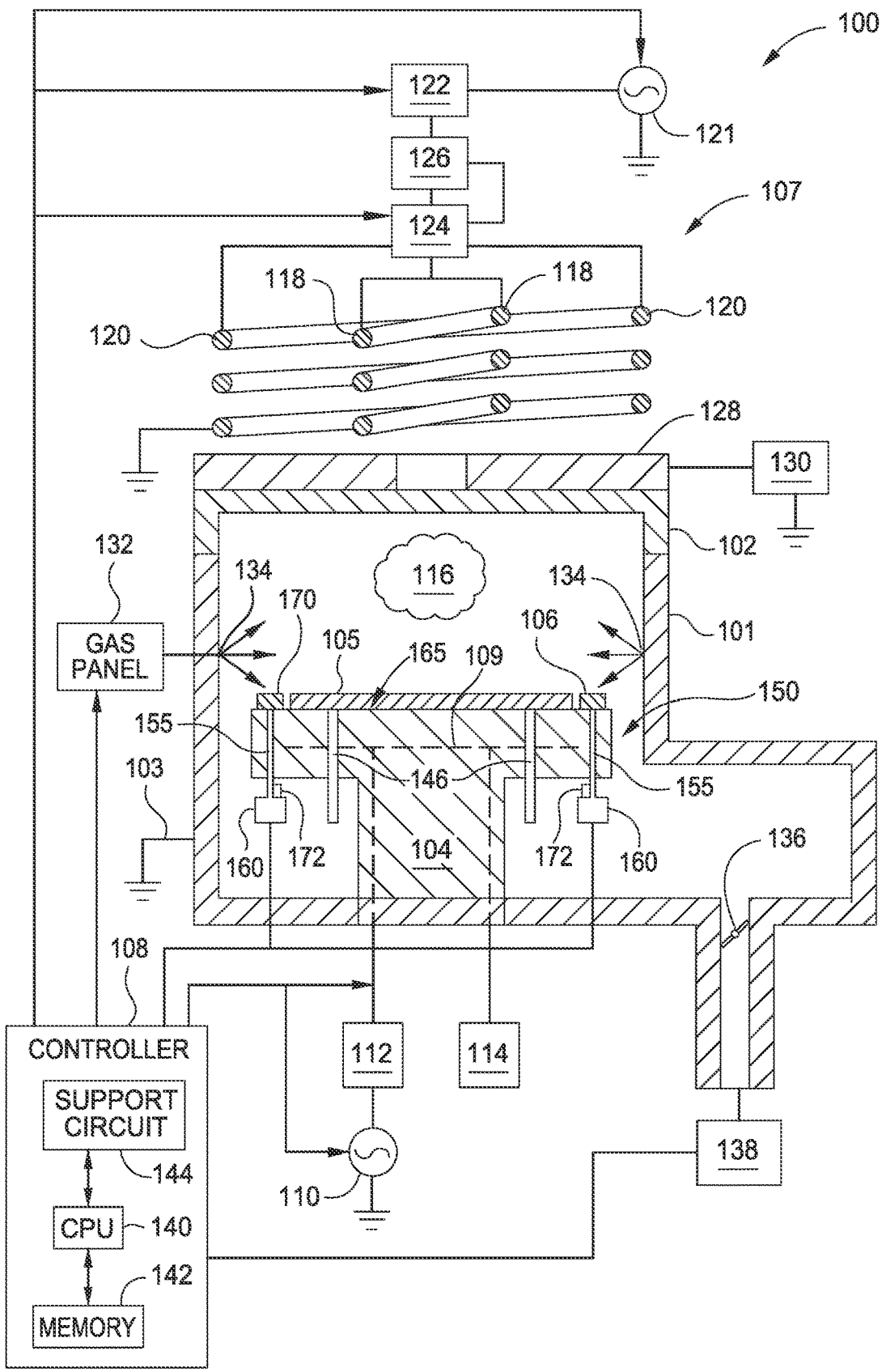
FIG. 1 is a schematic cross-sectional side view of a process chamber according to one example of the disclosure.

FIG. 1 is a schematic sectional view of a process chamber 100, according to one example of the disclosure. The process chamber 100 includes a chamber body 101 and a lid 102 disposed thereon that together define an inner volume. The chamber body 101 is typically coupled to an electrical ground 103. A substrate support assembly 104 is disposed within the inner volume to support a substrate 105 thereon during processing. A height-adjustable edge ring 106 is positioned around the periphery of the substrate 105 on the substrate support assembly 104. The process chamber 100 also includes an inductively coupled plasma apparatus 107 for generating a plasma of reactive species within the process chamber 100, and a system controller 108 adapted to control systems and subsystems of the process chamber 100.

The substrate support assembly 104 includes one or more electrodes 109 coupled to a bias source 110 through a matching network 112 to facilitate biasing of the substrate 105 during processing. The bias source 110 may illustratively be a source of up to about 1000 W (but not limited to about 1000 W) of RF energy at a frequency of, for example, approximately 13.56 MHZ, although other frequencies and powers may be provided as desired for particular applications. The bias source 110 may be capable of producing either or both of continuous or pulsed power. In some examples, the bias source 110 may be a DC or pulsed DC source. In some examples, the bias source 110 may be capable of providing multiple frequencies. The one or more electrodes 109 may be coupled to a chucking power source 114 to facilitate chucking of the substrate 105 during processing.

The inductively coupled plasma apparatus 107 is disposed above the lid 102 and is configured to inductively couple RF power into the process chamber 100 to generate a plasma 116 within the process chamber 100. The inductively coupled plasma apparatus 107 includes first and second coils 118, 120, disposed above the lid 102. The relative position, ratio of diameters of each coil 118, 120, and/or the number of turns in each coil 118, 120 can each be adjusted as desired to control the profile or density of the plasma 116 being formed. Each of the first and second coils 118, 120 is coupled to an RF power supply 121 through a matching network 122 via an RF feed structure 124. The RF power supply 121 may illustratively be capable of producing up to about 4000 W (but not limited to about 4000 W) at a tunable frequency in a range from 50 kHz to 13.56 MHz, although other frequencies and powers may be utilized as desired for particular applications.

In some examples, a power divider 126, such as a dividing capacitor, may be provided between the RF feed structure 124 and the RF power supply 121 to control the relative quantity of RF power provided to the respective first and second coils. In some examples, the power divider 126 may be incorporated into the matching network 122.

A heater element 128 may be disposed on the lid 102 to facilitate heating the interior of the process chamber 100. The heater element 128 may be disposed between the lid 102 and the first and second coils 118, 120. In some examples, the heater element 128 may include a resistive heating element and may be coupled to a power supply 130, such as an AC power supply, configured to provide sufficient energy to control the temperature of the heater element 128 within a desired range.

During operation, the substrate 105, such as a semiconductor wafer or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases are supplied from a gas panel 132 through entry ports 134 into the inner volume of the chamber body 101. The process gases are ignited into a plasma 116 in the process chamber 100 by applying power from the RF power supply 121 to the first and second coils 118, 120. In some examples, power from the bias source 110, such as an RF or DC source, may also be provided through the matching network 112 to electrodes 109 within the substrate support assembly 104. The pressure within the interior of the process chamber 100 may be controlled using a valve 136 and a vacuum pump 138. The temperature of the chamber body 101 may be controlled using fluid-containing conduits (not shown) that run through the chamber body 101.

The process chamber 100 includes the system controller 108 to control the operation of the process chamber 100 during processing. The system controller 108 comprises a central processing unit (CPU) 140, a memory 142, and support circuits 144 for the CPU 140 and facilitates control of the components of the process chamber 100. The system controller 108 may be one of any form of general-purpose computer processor that can be used in an industrial setting for controlling various chambers and sub-processors. The memory 142 stores software (source or object code) that may be executed or invoked to control the operation of the process chamber 100 in the manner described herein.

The substrate support assembly 104 includes the height-adjustable edge ring 106 that is movable relative to the substrate 105. To facilitate this movement, the substrate support assembly 104 includes a lift assembly 150 comprising at least three ring lift pins 155 coupled to a respective drive motor 160 (only two are shown in the view of FIG. 1). Each drive motor 160 is dedicated to one ring lift pin 155 in order to independently lift or lower each ring lift pin 155. The lifting and lowering of the ring lift pins 155 moves the height-adjustable edge ring 106 vertically relative to a chucking surface 165 of the substrate support assembly 104 as well as moving the height-adjustable edge ring 106 vertically relative to the substrate 105. Moving the height-adjustable edge ring 106 during processing tunes the plasma 116 which may enhance process results (e.g., etching uniformity and/or film deposition uniformity). Movement of the height-adjustable edge ring 106 may be measured using sensors 172 disposed adjacent to each of the ring lift pins 155. Each of the sensors 172 may be an encoder, a displacement sensor, or other type of motion sensor. Each of the drive motors 160 may be a stepper motor, a servo motor, a piezoelectric motor, or another type of actuator capable of lifting and lowering the ring lift pins 155.

However, during processing, a plane of a major surface 170 of the height-adjustable edge ring 106 should be parallel, or substantially parallel, to a plane of a major surface of the substrate 105 and/or a plane of the chucking surface 165 of the substrate support assembly 104. The plane of the major surface 170 of the height-adjustable edge ring 106 is perpendicular to a central axis of the edge ring 106. In some processes, the height-adjustable edge ring 106 may be substantially coplanar with the major surface of the substrate 105. If the major surface 170 of the height-adjustable edge ring 106 is not substantially parallel to the chucking surface 165 of the substrate support assembly 104, the plasma 116 may not be uniform. The phrase "substantially parallel" means less than 0.03 degrees, for example, less than about 0.02 degrees, from a reference datum plane (which may be the plane of the chucking surface 165 of the substrate support assembly 104). Further, during any movement of the height-adjustable edge ring 106, the height-adjustable edge ring 106 binds if any one of the drive motors 160 is significantly out of calibration relative to one of the other drive motors 160.

When installing the height-adjustable edge ring 106, it is important to level the height-adjustable edge ring 106 (e.g., position the height-adjustable edge ring 106 to be parallel or substantially parallel to a reference surface). Conventionally, the levelling procedure can take several hours up to about one day, which is time consuming and costly. However, using a calibration jig as described herein, the levelling procedure can take less than 5 minutes.

Figure 2:
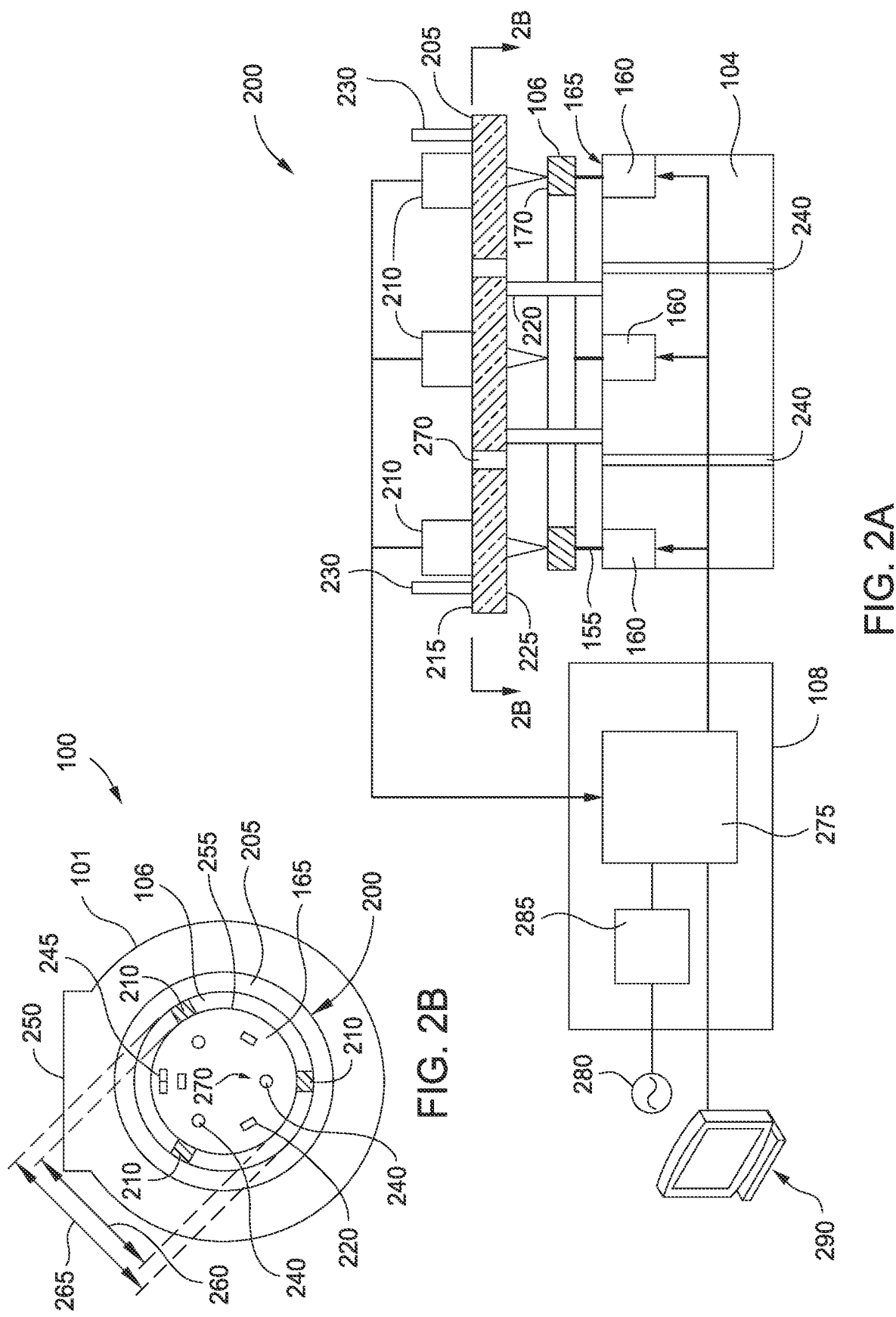
FIG. 2A is a schematic side view of a calibration jig for levelling the height-adjustable edge ring.
FIG. 2B is a top view along lines 2B-2B of FIG. 2A showing a portion of the process chamber of FIG. 1 having the calibration jig therein.

FIG. 2A is a schematic side view of a calibration jig 200 for levelling the height-adjustable edge ring 106. FIG. 2B is a top view along lines 2B-2B of FIG. 2A showing a portion of the process chamber 100 of FIG. 1 having the calibration jig 200 therein.

The calibration jig 200 includes a transparent plate 205 having at least three sensors 210 mounted on a first surface 215 of the transparent plate 205. Each of the sensors 210 may be an optical or non-contact displacement sensor such as a capacitive transducer or capacitive displacement sensor, a laser displacement transducer, an inductive position sensor, or any other type of non-contact sensor that measures linear displacement. Alternatively, each of the sensors 210 may be a contact displacement sensor, such as a linear variable differential transformer or other suitable measuring device.

Mounting pads 220 are positioned on an opposing second surface 225 of the transparent plate 205. The transparent plate 205 may be made of glass, clear plastics, such as an acrylic sheet, quartz, or another optically transparent material such that the sensors 210 can view the major surface 170 of the height-adjustable edge ring 106 therethrough. The mounting pads 220 are configured to contact specific locations of the chucking surface 165 of the substrate support assembly 104 and are utilized to space the transparent plate 205 a specific distance or height above the chucking surface 165 of the substrate support assembly 104. One or more handles 230 are coupled to the first surface 215 of the transparent plate 205 to aid in handling the calibration jig 200. Lift pin openings 240, each of which are sized to receive one of the substrate lift pins 146 shown in FIG. 1, are also shown in the substrate support assembly 104 of FIG. 2A.

An alignment indicator 245 is included on the transparent plate 205 to assist in properly aligning the calibration jig 200 within the chamber body 101. The alignment indicator 245 may be text, numbers, a directional arrow, other indicia, or a combination thereof. The alignment indicator 245 is utilized to inform personnel when installing the calibration jig 200 of the proper positioning of the calibration jig 200 relative to a feature of the chamber body 101, such as a slit valve opening 250 of the chamber body 101. Proper positioning of the calibration jig 200 is also aided by a scribe line 255 that has a diameter equal to a diameter 260 of the chucking surface 165 of the substrate support assembly 104. The diameter 260 of the chucking surface 165 of the substrate support assembly 104 is less than a diameter 265 of the transparent plate 205. In addition, proper positioning of the calibration jig 200 is also aided by openings 270 formed through the transparent plate 205. The openings 270 of the transparent plate 205 are configured to align with the lift pin openings 240 formed in the substrate support assembly 104.

Proper positioning of the calibration jig 200 relative to the chamber body 101 serves several functions. One function includes locating each of the sensors 210 with respect to a specific drive motor 160. For example, when the sensors 210 are activated and the calibration jig 200 is in operation, feedback from one of the sensors 210 is utilized to confirm the motion of the edge ring 106 in response to operation of a respective one of the drive motors 160 nearest to the sensor 210. In this manner, the sensors 210 provide feedback as to the accuracy of the information provided by the sensors 172, thus enabling the motors 160 to precisely position the edge ring 106 once the jig 200 is removed. Proper positioning of the calibration jig 200 also ensures that the mounting pads 220 are positioned on the chucking surface 165 of the substrate support assembly 104 such that any structures formed on the chucking surface 165 of the substrate support assembly 104 are avoided by the mounting pads 220. Additionally, the openings 270 of the transparent plate 205 are positioned with respect to the lift pin openings 240. Positioning the openings 270 as such allows the substrate lift pins 146 to extend through the openings 270 in case the substrate lift pins 146 are accidentally actuated during calibration of the height-adjustable edge ring 106.

Referring again to FIG. 2A, the calibration jig 200 is directly wired to a motion controller 275 of the system controller 108. The motion controller 275 is coupled to a power supply 280, which may be a DC power source, supplying electrical signals to each of the drive motors 160. A filter 285, such as a radio frequency filter, is provided between the power supply 280 and the motion controller 275. In some embodiments, output of one or both of the plurality of sensors 210 and the plurality of drive motors 160 is provided on a display screen of a monitor 290 coupled to the system controller 108. The sensors 172 (shown in FIG. 1) are also in communication with the motion controller 275. The sensors 172 are utilized to monitor and/or quantify the operation of the drive motors 160 when the drive motors 160 are actuated. For example, the sensors 172 are utilized to provide feedback to the motion controller 275 regarding the number of steps of the drive motors 160 when the drive motors 160 are actuated.

During a calibration process, the sensors 210 optically determine the position of the major surface 170 of the height-adjustable edge ring 106 relative to a reference surface, which in this example is a plane of the chucking surface 165 of the substrate support assembly 104. The parallelism of the major surface 170 of the height-adjustable edge ring 106 relative to the chucking surface 165 is determined by the sensors 210. The sensors 210 are in communication with a calibration software routine that is utilized to determine the position (both vertical and parallelism) of the height-adjustable edge ring 106 relative to the chucking surface 165 as well as provide feedback to the motion controller 275. The motion controller 275 then sends signals to the drive motors 160 in order to move one or more of the ring lift pins 155 to adjust the positional differences so that the edge ring 106 is moved to a parallel orientation relative to the chucking surface 165. For example, the sensors 210 determine the planarity of the major surface 170 of the height-adjustable edge ring 106 with respect to the reference surface, and the sensors 210 provide an output to the monitor 290 with the exact position thereof. The calibration process is fast as all positional differences may be calculated at one time. If the height-adjustable edge ring 106 is not parallel with, or substantially parallel with, the chucking surface 165 of the substrate support assembly 104, the sensors 210 provide a metric to the motion controller 275 to actuate one or more of the drive motors 160 to move the respective ring lift pins 155 upward or downward to adjust the inclination of the edge ring 106 relative to the chucking surface 165. The output of the sensors 210 may be an electrical signal representing the amount of linear displacement needed by one or more of the drive motors 160 in order to obtain parallelism between the height-adjustable edge ring 106 and the chucking surface 165 of the substrate support assembly 104. The electrical signals from the sensors 210 are converted by the software in the motion controller 275 into a length unit, such as microns, to assist in providing a displacement value to the one or more drive motors 160. The electrical signal may be about 4 milli Amps (mA) to about 20 mA that is converted to microns, and the microns may be calculated to correspond with a step number (s) of the drive motors 160.

A method of calibrating the height-adjustable edge ring 106 is described below. The method includes a software routine with closed-loop feedback that enables one or more of the following: the method verifies that the sensors 210 are positioned in the correct location with respect to the drive motors 160; the method enables a fast calibration routine (typically less than 5 minutes) by calculating all offsets simultaneously (i.e., not by an iterative process); the method includes determining calibration values that are automatically stored; the method works with any thickness of a height-adjustable edge ring (e.g., whether the ring is new or eroded). The method also includes using the calibration jig 200 to determine, for example, whether the drive motors 160 are installed in the correct positions and/or are connected with the correct polarity so that the drive motors 160 move the ring lift pins 155 to move the height-adjustable edge ring 106 in the desired direction.

Figure 3:
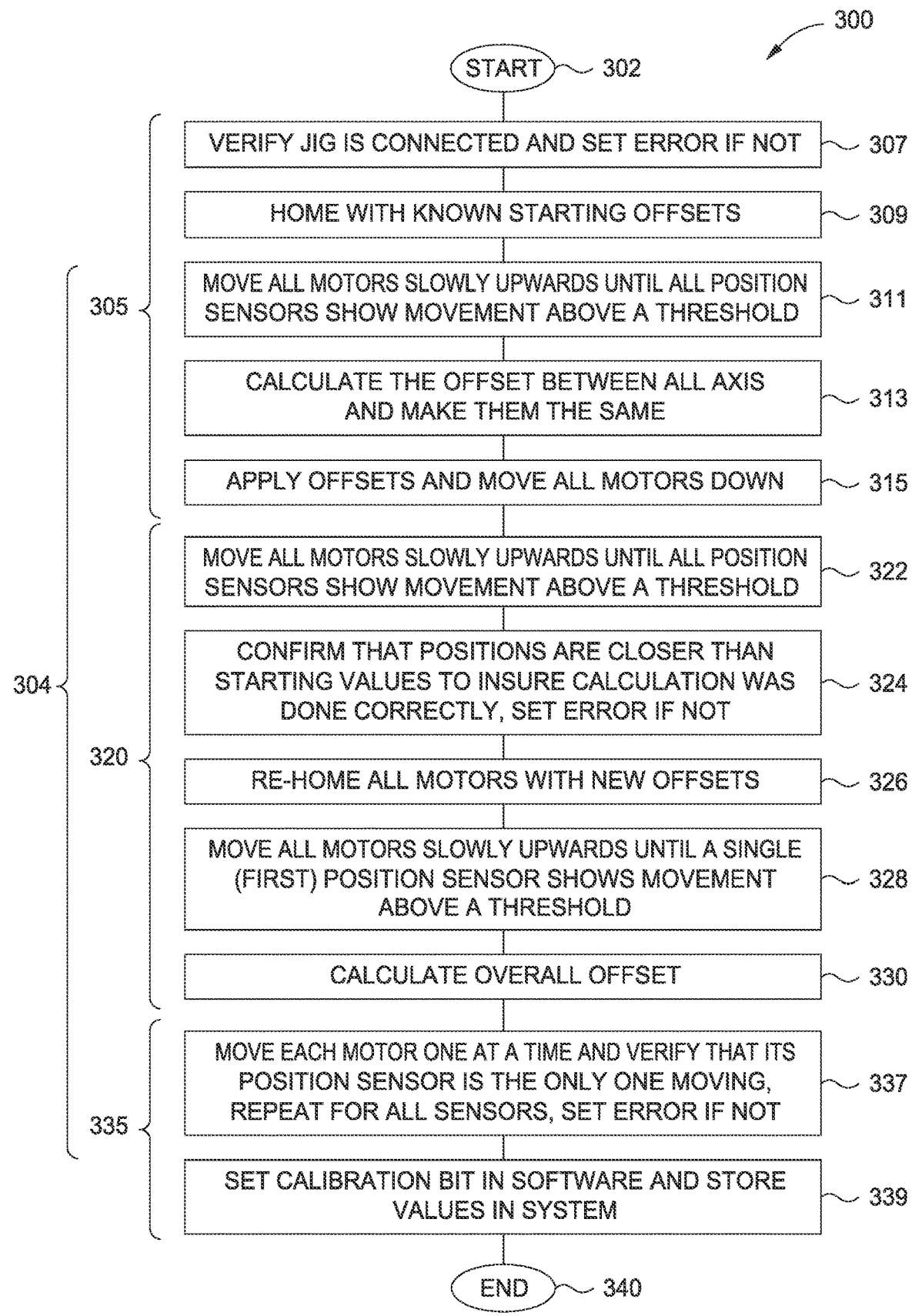
FIG. 3 is a flowchart outlining embodiments of a method of utilizing the calibration jig as described herein.

FIG. 3 is a flowchart 300 outlining embodiments of a method of utilizing the calibration jig 200 as described herein. The method 300 starts at 302 where the chamber body 101 is opened so that the calibration jig 200 may be installed as described in FIGS. 2A and 2B. It is understood that the method 300 may be utilized to calibrate a new height-adjustable edge ring 106 as well as re-calibrate a used (i.e., eroded) height-adjustable edge ring 106.

The method 300 may be be broken down to a simplified method 304 having a move mode 305, a calibration mode 320, and a verification mode 335 before ending at 340. The move mode 305 includes quantifying operation of the drive motors 160 and/or the movement of the ring lift pins 155 by the drive motors 160. The calibration mode 320 includes levelling of the height-adjustable edge ring 106 with the chucking surface 165 of the substrate support assembly 104. The verification mode 335 includes verifying that the calibration performed in the calibration mode 320 is correct. The simplified method 304 will be explained in more detail with the remainder of the method 300.

Move mode 305 includes, at operation 307, verifying the calibration jig 200 is properly connected to the system controller 108. If the calibration jig 200 is not properly connected to the system controller 108, an error may be set in the software. For example, it can be determined that the calibration jig 200 is not plugged-in to the system controller 108 if one or more of the sensors 210 indicate an output of less than 4 mA. For example, one of the sensors 210 may send a low current signal greater than 4 mA upon connection, which may be read by the system controller 108 to indicate a proper connection between the sensor and the system controller 108.

Move mode 305 also includes, at operation 309, homing the height-adjustable edge ring 106 with known offsets. Control of the drive motors 160 is a measured distance so that the system controller 108 can precisely control movement of the ring lift pins 155 by controlling the drive motors 160. Initially, movement of each of the ring lift pins 155 by the drive motors 160 is calculated from this start position using movement of the ring lift pins 155 by the drive motors 160 in other operations in the move mode 305. The home position may be an estimated process position for the height-adjustable edge ring 106, for example, a position of the height-adjustable edge ring 106 relative to the chucking surface 165 of the substrate support assembly 104.

Move mode 305 also includes, at operation 311, all the drive motors 160 are actuated to move the ring lift pins 155 slowly upwards until all of the sensors 210 show movement of the height-adjustable edge ring 106 above a threshold value, for example, greater than about 60 microns i.e., a detectable value above noise levels for the sensors. Move mode 305 also includes, at operation 313, calculating any offset(s) between all axes and normalizing the offsets. The term "offsets" is defined as the amount (or distance) that each of the ring lift pins 155 is moved by the drive motors 160 prior to contacting the edge ring 106.

Move mode 305 concludes at operation 315 by applying all offsets and actuating all of the drive motors 160 to move all of the ring lift pins 155 downward. The downward movement concludes at a hard stop at an extreme down position of each of the ring lift pins 155 (i.e., to a position where the ring lift pins 155 can no longer move downward). Thus, a "start" position may be found after moving all of the ring lift pins 155 to the extreme down position from the "home" position described above at operation 309. This ensures that all of the ring lift pins 155 are below a bottom surface of the height-adjustable edge ring 106.

The simplified method 304 continues to the calibration mode 320. The calibration mode 320, at operation 322, includes moving all of the drive motors 160 slowly upwards until all of the sensors 210 shown movement above the threshold (i.e., about 60 microns).

The calibration mode 320, at operation 324, includes confirming that positions are closer than starting values at operation 315 to ensure calculations at operation 313 were done correctly. The movement of the ring lift pins 155 by the drive motors 160 is now detected above a noise threshold level, and a known count on the stepper motors (e.g., the drive motors 160) can be correlated to movement of the height-adjustable edge ring 106.

The calibration mode 320, at operation 326, includes re-homing all of the drive motors 160 with new offsets based on differences in distances traveled by each of the ring lift pins 155 (i.e., fully retracted and offsets; or the positon that the ring lift pins 155 are just touching the ring) to a new zero position. For example, for the three sensors having three measured values (offsets), e.g., a first sensor having a first measurement value $V_1$, a second sensor having a second measurement value $V_2$, and a third sensor having a third measurement value $V_3$ wherein the first measurement value is greater than the second measurement value and the second measurement value is greater than a third measurement value ($V_1 > V_2 > V_3$), the new offsets can be calculated. The new offset $V_{N1}$ for the first sensor can be calculated by subtracting the medium value $V_2$ from the high value $V_1$ ($V_1 - V_2$). The new offset $V_{N2}$ for the second sensor is equal to the old value $V_2$. Finally, the new offset $V_{N3}$ for the third sensor can be calculated by adding the medium value $V_2$ to the low value $V_3$ ($V_3 + V_2$). In this manner, all the offsets for adjusting the motor motion and pin displacement can bring the height-adjustable edge ring 106 into alignment, i.e., substantially parallel, with the chucking surface 165. Thus, in operation 326, parallelism between the height-adjustable edge ring 106 and a plane of the chucking surface 165.

The calibration mode 320, at operation 328, includes actuating all of the drive motors 160 to move the ring lift pins 155 slowly upward until a single or first sensor 210 of the plurality of sensors 210 shows movement above the noise threshold level for any of the sensors 210. Operation 328 is performed to ensure the ring lift pins 155 contact the height-adjustable edge ring 106.

The calibration mode 320 concludes at operation 330, wherein an overall offset is calculated. In some embodiments, at operation 330, the plane of the major surface 170 of the height-adjustable edge ring 106 should be parallel, or substantially parallel, to the plane of the chucking surface 165 of the substrate support assembly 104. The overall offset is the initial position of the plane of the major surface 170 of the height-adjustable edge ring 106 above the chucking surface 165 suitable for plasma processing a substrate thereon and actuation of any of the drive motors 160 will result in movement of the respective ring lift pin 155 which moves the height-adjustable edge ring 106. While operation 326 obtains parallelism, operation 330 facilitates finding a zero offset point after which the height-adjustable edge ring 106 just starts to move upwards.

The simplified method 304 continues to the verification mode 335. The verification mode 335 includes, at operation 337, actuating each drive motor 160 of the plurality of drive motors 160 one at a time to verify that each specific drive motor 160 is the only one moving the respective ring lift pin 155. If the respective ring lift pin 155 is not moving, an error is assigned. The movement is determined by the sensors 210 registering a change in the measured value. Operation 337 is repeated for all the drive motors 160. For example, each of the drive motors 160 may be controlled to move the respective ring lift pins 155 100 microns which are verified by a respective sensor 210.

The verification mode 335 includes, at operation 339, setting calibration information in the software and storing values in the system controller 108. The calibration information puts a hard limit for the stepper motors in order to prevent damage to the height-adjustable edge ring 106 and/or the process chamber 100.

Examples of the present disclosure significantly reduce downtime of a processing chamber by calibrating and levelling a height-adjustable edge ring 106. For example, levelling of the height-adjustable edge ring 106 may be performed in five minutes or less as compared to conventional levelling processes taking several hours up to an entire day.

While the foregoing is directed to examples of the present disclosure, other and further examples of the disclosure may be devised without departing from the basic scope thereof, and the scope thereof is determined by the claims that follow.

What is claimed is:

1. A method for levelling an edge ring relative to a reference surface, the method comprising:
    positioning a calibration jig relative to the reference surface;
    moving the edge ring relative to the reference surface using a plurality of ring lift pins each coupled to a dedicated drive motor positioned relative to the edge ring at three positions;
    sensing movement of the edge ring using sensors coupled to the calibration jig, each sensor corresponding to a position of a respective ring lift pin;
    calculating an offset that includes a difference in an amount of movement between each of the ring lift pins; and
    storing a calibration value in a system controller.

2. The method of claim 1, wherein the moving comprises actuating the drive motors to move a respective lift pin coupled to the edge ring.

3. The method of claim 2, wherein the moving further comprises moving the lift pin upwards.

4. The method of claim 3, wherein the moving further comprises moving the lift pin to an extreme downward position.

5. The method of claim 1, wherein the moving further comprises actuating each of the drive motors separately to verify operation of each drive motor.

6. The method of claim 3, wherein the sensing further comprises sensing a current or a voltage of the drive motors.

7. The method of claim 6, wherein the current or the voltage is calibrated to the displacement of a respective lift pin.

8. A method for levelling an edge ring relative to a reference surface, the method comprising:
    positioning a calibration jig relative to the reference surface;
    moving the edge ring relative to the reference surface using a plurality of ring lift pins each coupled to a dedicated drive motor positioned relative to the edge ring at three positions;
    quantifying movement of the plurality of ring lift pins;
    leveling the edge ring with the reference surface; and
    verifying the calibration.

9. The method of claim 8, wherein quantifying movement of the plurality of ring lift pins comprises homing the edge ring with known offsets using a controller.

10. The method of claim 9, wherein the calibration jig further comprises sensors corresponding to a position of a respective ring lift pin, and wherein quantifying movement of the plurality of ring lift pins comprises actuating drive motors of the plurality of ring lift pins upwards each of the sensors detect movement above a threshold value.

11. The method of claim 10, wherein quantifying movement of the plurality of ring lift pins comprises calculating any offsets between all axes and normalizing the offsets.

12. The method of claim 11, wherein quantifying movement of the plurality of ring lift pins comprises applying all offsets and actuating all of the drive motors to move the plurality of ring lift pins downward.

13. The method of claim 8, wherein the calibration jig further comprises sensors corresponding to a position of a respective ring lift pin, and wherein leveling the edge ring comprises actuating the drive motors of each of the plurality of ring lift pins upward until the sensors detect movement above a threshold value.

14. The method of claim 13, wherein leveling the edge ring further comprises re-homing all of the drive motors with new offsets based on differences in distances traveled by each of the plurality of ring lift pins to a new zero position.

15. A method of levelling an edge ring relative to a reference surface, the method comprising:
    positioning a calibration jig relative to the reference surface;
    homing the edge ring with known offsets;
    calibrating offsets of a plurality of ring lift pins configured to move the edge ring relative to a reference surface; and
    verifying the calibration of the offsets.

16. The method of claim 15, wherein homing the edge ring with known offsets comprises determining a difference between an extreme down position and an initial home position of the plurality of ring lift pins.

17. The method of claim 15, wherein calibrating offsets comprises actuating drive motors coupled to the plurality of ring lift pins upwards until all of a plurality of sensors coupled to the calibration jig detect movement above a threshold value.

18. The method of claim 17, wherein calibrating offsets further comprises confirming that positions of the plurality of ring lift pin positions are closer than an extreme down position of the plurality of ring lift pins.

19. The method of claim 18, wherein calibrating offsets comprises re-homing the drive motors with new offsets based on differences in distances traveled by each of the plurality of ring lift pins to a new zero position.

20. The method of claim 19, wherein calibrating offsets further comprises actuating the drive motors to move the plurality of ring lift pins upwards until a first sensor of the plurality of sensors detects movement above a noise threshold level.

* * * * *